United States Patent
Agostinelli et al.

(10) Patent No.: US 6,200,713 B1
(45) Date of Patent: Mar. 13, 2001

(54) METHOD AND APPARATUS FOR LOCATING ARRAYS WITH PERIODIC STRUCTURES RELATIVE TO COMPOSITE IMAGES

(75) Inventors: John A. Agostinelli, Rochester; Lee W. Tutt, Webster, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/360,018

(22) Filed: Jul. 23, 1999

(51) Int. Cl.$^7$ ............................... G03C 7/14; G03C 9/00; G03C 9/02; G03C 9/08; G03B 27/32
(52) U.S. Cl. ..................... 430/22; 430/201; 430/946; 347/233; 347/234; 347/242; 347/244; 347/248; 347/257; 347/258; 355/22; 355/33; 396/324; 396/330
(58) Field of Search ............................. 430/22, 201, 946; 347/233, 234, 242, 244, 248, 257, 258; 35/22, 33; 396/324, 330

(56) References Cited

U.S. PATENT DOCUMENTS

| | | |
|---|---|---|
| 3,953,869 | 4/1976 | Wah Lo et al. |
| 4,772,582 | 9/1988 | DeBoer ............................. 430/201 |
| 4,876,235 | 10/1989 | DeBoer ............................. 430/201 |
| 5,183,798 | 2/1993 | Sarraf et al. ..................... 430/201 |
| 5,276,478 | 1/1994 | Morton ............................. 355/22 |
| 5,279,912 | 1/1994 | Telfer et al. ..................... 430/946 |
| 5,479,270 | 12/1995 | Taylor ............................. 430/946 |
| 5,492,578 | 2/1996 | Morton ............................. 355/122 |
| 5,539,487 | 7/1996 | Taguchi et al. ................. 355/22 |
| 5,557,413 | 9/1996 | Ebihara et al. ................. 358/296 |
| 5,729,332 | 3/1998 | Fogel et al. ..................... 355/22 |
| 5,835,194 | * 11/1998 | Morton ............................. 355/22 |
| 5,995,132 | * 11/1999 | Tutt ................................. 347/134 |
| 6,069,680 | * 5/2000 | Kessler et al. ................. 355/22 |

FOREIGN PATENT DOCUMENTS

| | | |
|---|---|---|
| 0 596 629 A2 | 10/1993 | (EP) . |
| 0 659 026 A2 | 12/1994 | (EP) . |

\* cited by examiner

*Primary Examiner*—Richard L. Schilling
(74) *Attorney, Agent, or Firm*—Svetlana Z. Short

(57) ABSTRACT

The method for positioning an array with periodic structures, for forming an image thereon, comprises the following steps: (a) providing a first beam of light by a first light source; (b) passing this first beam of light through the array; (c) forming a light line corresponding to the first light source with the first beam of light after the first beam of light passes through the array such that the light line is perpendicular to long axes of the periodic structures; (d) rotating the array to rotate the light line across a first detector; (e) producing a signal when the light line sweeps across the first detector; (f) determining when maximum signal is produced by the first detector; and (g) rotating the array to a proper position based on angular position corresponding to this maximum signal. According to an another embodiment of the present invention, an apparatus for locating an array having a periodic structure comprises: (i) a stage rotatably supporting the array; (ii) a first light source, providing a first alignment light beam, the first light source being located to project light onto one side of the array; (iii) a coarse alignment detector located on another side of the array; and (iv) an alignment lens located between the array and the course alignment detector, the alignment lens and the array, together, providing a light line corresponding to the first light source in a plane where the course alignment detector is located, wherein rotation of said array produces a corresponding rotation of the light line in the plane.

23 Claims, 8 Drawing Sheets

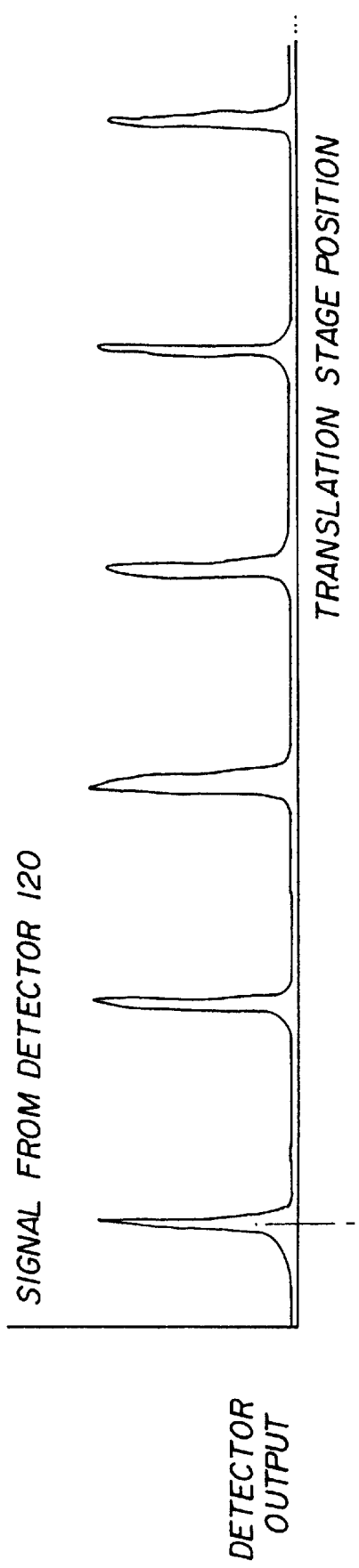
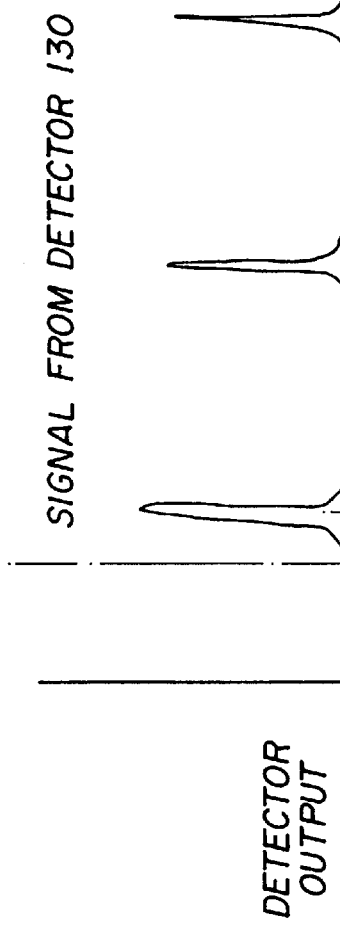
FIG. 10A
FIG. 10B

METHOD AND APPARATUS FOR LOCATING ARRAYS WITH PERIODIC STRUCTURES RELATIVE TO COMPOSITE IMAGES

CROSS-REFERENCE TO RELATED APPLICATIONS

This application is related to U.S. Ser. No. 09/360,462, filed Jul. 23, 1999, entitled AN IMPROVED METHOD AND APPARATUS FOR PRECISE POSITIONING OF ARRAYS WITH PERIODIC STRUCTURES RELATIVE TO COMPOSITE IMAGES, in the name of John A. Agostinelli et al., U.S. Ser. No. 09/128,521, filed Aug. 3, 1998, now U.S. Pat. No. 6,069,680, entitled FLYING SPOT LASER PRINTER APPARATUS AND A METHOD OF PRINTING SUITABLE FOR PRINTING LENTICULAR IMAGES, in the name of David Kessler et al; U.S. Ser. No. 08/961,057, filed Oct. 30, 1997, now U.S. Pat. No. 5,995,132, entitled A METHOD FOR PRINTING INTERDIGITATED IMAGES, in the name of Lee W. Tutt; U.S. Ser. No. 08/828,637, filed Mar. 31, 1997, now U.S. Pat. No. 5,835,194, entitled APPARATUS AND METHOD FOR ALIGNING AND PRINTING MULTIPLE IMAGES, in the name of Roger R. A. Morton; and U.S. Ser. No. 09/128,077, filed Aug. 3, 1998, entitled PRINTING LENTICULAR IMAGES, in the name of David Kessler et al.

FIELD OF THE INVENTION

The present invention relates to the printing of interdigitated images which will be used in conjunction with lenticular arrays, blocking line screens or the like. In particular, it relates to a method and an apparatus for achieving alignment of a printed interdigitated images with respect to arrays with periodic structures, for example, lenticular arrays or blocking line screens.

BACKGROUND OF THE INVENTION

Lenticular arrays are used to give images an appearance of depth. More specifically, a lenticular array comprises a transparent upper layer A having narrow, parallel lenticules (cylindrical lenses) B on an outer surface, and an image-containing substrate layer C. (See FIG. 1A). The image on the substrate layer C is called a composite image. It is formed by a set of image lines D. The image, viewed by the observer who is looking at a lenticular array, is called a lenticular image. The two layers of a lenticular array provide the lenticular image such that different views of this lenticular image are selectively visible as a function of the angle from which the lenticular array is viewed. If the viewed image is made by bringing together into a single composition a number of different parts of a scene photographed from different angles, and the lenticules are vertically oriented, each eye of a viewer will see different elements and the viewer will interpret the net result as a three dimensional (3-D) image. The viewer may also move his head with respect to the lenticular array, thereby observing other views with each eye and enhancing the sense of depth.

Another method for showing 3-D images is the use of a parallax media such as a blocking line screen (FIG. 1B) positioned at a specific distance from the image lines forming a composite image. This process, known as a parallax process, causes blocking of all image lines except those corresponding to one specific image. This allows the viewer's eyes to view different images as three-dimensional (3-D) images, when the blocking line screen is oriented vertically.

When a lenticular array or a blocking line screen is oriented horizontally, each eye receives the same image. In this case, the multiple images can give illusion of motion when the composite image, located on the back of a lenticular array or a blocking line screen, is rotated about a line parallel to the viewer's eyes. Thus, a simulation of motion is achieved by the process of either tipping a lenticular array or a blocking line screen containing the composite image, or by movement of the viewer's head to a different angle with respect to the lenticular array or a blocking line screen.

Whether the lenticules or the blocking line screen is oriented vertically or horizontally, each of the viewed images is generated by the image lines which have been interlaced at the spatial frequency of the lenticular array (determined by the lenticule's width) or the blocking line screen. Interlacing lines of each image with other images is referred to as interdigitation. A full set of such interdigitated image lines forms the composite image. Interdigitation can be better understood by using an example of four images used to form a composite image with a material having at least three lenticules. In this example, line 1 from each of the four images is in registration with the first lenticule; line 2 from each of the four images is in registration with the second lenticule; etc. Each lenticule is associated with a plurality of image lines D or an image line set (See FIG. 1C), and the viewer should see only one image line of each set with each eye for each lenticule. It is imperative that the image line sets be registered accurately with respect to the lenticules, so that the proper picture is formed when the assembly is viewed. However, this is difficult to achieve.

For example, one method of conventional recording of the interdigitated image lines requires recording of the interdigitated image lines on a recording material contained on the substrate layer C and then attaching the substrate layer C to the upper layer A, with the recorded image lines D in precise alignment to the lenticules B to yield the desired image structure. The precise alignment of the specific lenticules with the desired image line set during the attachment of the recording material to the lenticular overlay (i.e., the upper layer A) is difficult to achieve. The imprecise alignment results in a degraded image quality.

Sometimes, the composite image is written to a separate planar sheet, thereby forming an image sheet, which is then aligned and bonded to the back of the lenticular array. For example, U.S. Pat. No. 5,492,578 discloses a method and an apparatus for aligning an image sheet with a lenticular array by bending and stretching of the image sheet relative to the lenticular array while monitoring the alignment during the bonding operation. The technique requires much manual manipulation and a flexible media for the image sheet. U.S. Pat. No. 5,479,270 discloses a method and apparatus for aligning a lenticular array to a separate image sheet that uses a video camera and Moire techniques.

Conventional recording of composite images has been accomplished with a stereoscopic image recording apparatus that uses optical exposure. A light source, such as a halogen lamp, is projected through an original image, via a projection lens, and the light rays are transmitted through the lenticules and focused on the substrate layer of the lenticular array. The composite image is exposed on a recording material of the substrate layer as interdigitated image lines. However, the quality of the composite image is degraded by aberration introduced by the lenticular.

Contact print exposure from a composite image negative to a radiation sensitive layer coated on the back of and in alignment with a lenticular array has been disclosed in U.S. Pat. No. 5,729,332. The disclosed alignment method makes use of multiple video cameras and detectors as well as of special reference grid structures fabricated into the lenticular array and of similar grid structures on the image negative. Analysis of Moire fringes produced by the combination of the grid structures is used to achieve alignment between the lenticular array and the image negative.

Recording of the composite images by scanning exposure to the back of lenticular arrays is also known. U.S. Pat. No. 5,539,487 "Method and Apparatus for Recording Stereoscopic Images and Lenticular Recording Material Used Therefor" by S. Taguchi and S. Igarashi discloses a method of directly exposing a light sensitive recording layer (typically of silver halide emulsion) coated on the backside of a lenticular array. The exposure device utilizes three optical wavelengths which are either scanned or CRT (full image) projected to achieve full color. Post processing is necessary to develop the image as in most silver halide films. The pitch measurement technique disclosed in U.S. Pat. No. 5,539,487 teaches the use of a light emitter cooperating with a light detector. The light emitter and the light detector are positioned just beyond opposite edges of the lenticular array such that the light path between the emitter and detector is parallel to the plane of the lenticular array and the light beam traverses parallel to the long axes of the lenticules. The lenticular array is translated in a direction perpendicular to the long axes of the lenticules. Thus, the light emitted by the emitter and propagated toward the detector can be obstructed or transmitted as this light alternatively strikes the edge of a lenticule or propagates along the valley between alternate lenticules. The signal generated by the detector is used to provide information about the pitch of the lenticular array. However, the resultant signal modulation is relatively low, making it difficult to accurately determine array pitch. In another embodiment this patent discloses the use of a position marker. This marker is provided on the lenticular array at a site outside of the image recording region. This requires that the lenticular array be oversized and necessitates trimming to remove the region containing the marker. This increases the cost of production and wastes portions of the lenticular arrays. This patent is silent with respect to whether or how the lenticular array is rotationally aligned with respect to image lines.

The publication "Development of Motion Image Printer," by H. Akahori, Kenji Iwano, K. Ikeda, Y. Fukui, K. Nobori, K. Kayashima, IS&T 50th Annual Conference Proceedings, page 305, discusses a printer for printing stereoscopic images using a thermal head and thermal dye transfer in registration with the back side of a lenticular array, forming an integral stereoscopic image. The lenticular array must be heated in order to achieve the proper pitch of the lenticules for accurate registration of the image lines with the correct lenticules.

U.S. Pat. No. 5,279,912 disclosed the writing of a composite image by direct scanning exposure of a radiation sensitive layer that is coated on the back of a lenticular array. An observer would see a three-dimensional image by looking at the lenticular array. The disclosure teaches a registration technique that uses a separate light beam of a wavelength different from those that are scanned over the radiation sensitive layer to form the composite image. U.S. Pat. No. 5,279,912 does not disclose an automatic method for angular alignment of the composite image with respect to the lenticular array.

European patent publications 0 596 629 A2 and 0 659 026 A2 disclose the use of a scanning laser beam to thermally transfer colorant from a donor sheet to receiver layer on a lenticular array, for the purposes of providing three-dimensional images. Patent publication 0 596 629 A2 discloses the use of a pre-objective lens two-axis scanner and the use of special structures on the lenticular array outside of the image area. This requires trimming of the lenticular array after the printing of image lines, in order to eliminate the portions (of the lenticular array) that have these structures. Patent publication 0 659 026 A2 discloses the use of detector arrays to achieve registration of a printed composite image to the lenticules. The detector array senses the position of the writing laser beam as it exposes the donor while the writing laser beam moves along the fast-scan axis (which, in this case, is perpendicular to the long axes of the lenticules). Some of the light passes through the absorbing donor sheet as well as any previously deposited colorant and is imaged by the appropriate lenticule to a position on the detector array that gives information on the location of the focused spot (in the plane of the donor sheet) with respect to the lenticular array. This information is used to modulate the writing laser beam to give the appropriate transfer of colorant at the appropriate position on the receiver. Disadvantages of this registration method are its complexity and low light levels or possibly no light delivered to the detectors, unless the transferred colorants are diffusing to the laser light or unless the diffusing layer is attached to the lenticular array. Also, although the two European patent applications discuss the possibility that the fast-scan axis could be parallel to the long axes of the lenticules, these patent applications are silent with respect to how to achieve the required rotational alignment of the fast-scan axis with the long axis of the lenticules.

SUMMARY OF THE INVENTION

It is an object of the present invention to provide an improved method and apparatus for aligning a lenticular array or a blocking line screen with a set of interdigitated image lines forming a composite image.

Another object of the present invention is to provide a method and apparatus to provide simple sensing and control of the rotational spatial relationship between the composite image and the lenticular array or the blocking line screen in order to achieve rotational alignment of the composite image with respect to the lenticular array or the blocking line screen.

According to the present invention, the method for positioning an array with periodic structures, for forming an image thereon, comprises the following steps: (a) providing a first beam of light by a first light source; (b) passing this first beam of light through the array; (c) forming a light line corresponding to the first light source with the first beam of light after the first beam of light passes through the array such that the light line is perpendicular to long axes of the periodic structures; (d) rotating the array to rotate the light line across a first detector; (e) producing a signal when the light line sweeps across the first detector; (f) determining when maximum signal is produced by the first detector; and (g) rotating the array to a proper position based on angular position corresponding to this maximum signal.

According to an embodiment of the present invention, the method also includes the step of:

producing image lines on a receiver surface of the array by scanning a writing beam across this array such that a fast-scan axis is substantially parallel to the long axes of the periodic structures.

Also, according to an embodiment of the present invention, this method may further include the following steps: (i) translating the array in a direction substantially perpendicular to the fast scan axis; (ii) scanning a second light beam along the fast-scan axis; (iii) detecting the scanned second light beam alternatively by a second detector and a third detector, the second and third detectors being located near opposite edges of the array along the fast-scan axis; (iv) providing substantially periodic signals by the second and the third detectors in accordance with their detection of the second light beam; (v) determining relative phases of the periodic signals, the relative phases corresponding to misalignment of the array; (vi) sensing phases of the periodic signals and rotating the array such that the long axes are substantially parallel to the fast-scan axis.

According to an embodiment of the present invention the image lines are written to be in proper alignment with a lenticular array or a blocking line screen, using a laser to thermally transfer color sequentially from thermal donor materials (cyan, magenta, and yellow for color), in registration, onto the lenticular array or the blocking line screen. This method creates a high-resolution lenticular image.

According to an embodiment of the present invention, a method of transferring a scaled composite image directly to a lenticular array having a plurality of lenticules, the method utilizing sensing and control of an angular relationship between a fast-scan axis of a focused writing laser beam and a lenticular array direction, the lenticular array direction being parallel to long axes of the lenticules, the method comprising a) bringing the long axes of the periodic structures of the array into rotational alignment with the fast-scan axis of the focused writing laser beam by (i) translating the array in a direction substantially perpendicular to the fast-scan axis; (ii) scanning a scanner light beam along the fast-scan axis; (iii) detecting the scanned second light beam alternatively by a one of two detectors, the two detectors being located near opposite edges of the array along the fast-scan axis; (iv) providing substantially periodic signals by the two detectors in accordance with their detection of the light beam; (v) determining relative phases of the periodic signals, the relative phases corresponding to misalignment of the array; (vi) sensing phases of the periodic signals and rotating the array such that the long axes are substantially parallel to the fast-scan axis; (b) bringing thermal donor materials in contact with a back surface of the lenticular array; c) modulating the focussed writing laser beam in accordance with image data; and d) scanning the focussed writing laser beam along the fast-scan axis across the thermal donor materials and translating the array in a cross fast-scan axis direction.

According to another aspect of the present invention, an apparatus for locating an array having a periodic structure, comprises: (i) a stage rotatably supporting the array; (ii) a first light source, providing a first alignment light beam, the first light source being located to project light onto one side of the array; (iii) a coarse alignment detector located on another side of the array; and (iv) an alignment lens located between the array and the course alignment detector, the alignment lens and the array, together, providing a light line corresponding to the first light source in a plane where the course alignment detector is located, wherein rotation of said array produces a corresponding rotation of the light line in the plane.

It is an advantage of the present invention that it provides an improved method for generating a high quality interdigitated image lines in alignment with a lenticular array or a blocking line screen. According to the preferred embodiment of the present invention, this method is dry and thus requires no wet solutions. The method also does not require a post alignment step and thus does not require stretching or heating the composite image containing sheet in order to obtain the proper pitch of the multiple image lines. The completely automatic (i.e., no manual intervention is required) and robust alignment method is achieved with simple, low cost components.

It is also an advantage of the present invention that it provides rotational registration of the lenticular array or the blocking line screen with respect to the composite image, an appropriate line pitch for the composite image with respect to the pitch of the lenticular array or blocking line screen, and registration of the center view in the view sequence with respect to the lenticular array or the blocking line screen, so that the center view is observed at the desired position with respect to the observer.

BRIEF DESCRIPTION OF THE DRAWINGS

FIG. 10 shows the periodic signals from each photodetector comprising the fine rotational alignment detection means. The phase difference between the signals is also shown and corresponds to the rotational misalignment.

DETAILED DESCRIPTION OF THE INVENTION

In this embodiment of the present invention we provide an improved method and apparatus for performing scanning exposure of a colorant donor sheet by a laser induced thermal transfer of colorant from the donor sheet. The composite image is recorded directly on the back of a lenticular array or the blocking line screen. The recorded composite image is rotationally aligned with the lenticular array or the blocking line screen by sensing and control of the angular relationship between fast-scan axis and either a lenticular array direction, or the blocking line screen direction. The lenticular array direction is defined as direction parallel to the long axis of the lenticules. The blocking line screen direction is defined as a direction parallel to the blocking lines of the blocking line screen. More specifically, according to this embodiment, the improved apparatus forms interdigitated image lines using one or more focused scanning laser beams while providing: i) an automatic rotational alignment of the fast-scan axis with the lenticular or the blocking line screen direction, ii) an improved automatic measurement of lenticule or blocking line pitch, and iii) an improved center view alignment. This apparatus is shown schematically in FIG. 2A.

It is assumed that image data 5, corresponding to a composite image that provides a plurality of views of either a three-dimensional image or a motion image sequence or a multiple-still image sequence, has been prepared as a digital file 7 according to procedures that are well known in the art. This digital file 7 contains code values for each pixel location of the composite image to be printed. The composite image corresponding to the image data 5 stored in the digital file 7 is printed directly on the back of lenticular array 8 (having a plurality of lenticules 8A) or the blocking line screen 9 (not shown), in precise registration with the lenticular array 8 or the blocking line screen 9 as described below.

Figure 1A:
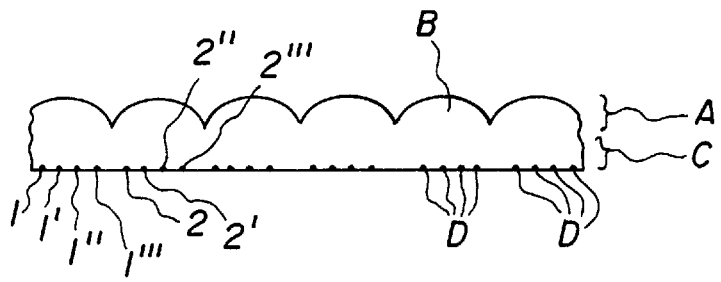
FIG. 1A is a schematic cross-sectional view of a prior art lenticular array.
Figure 1B:
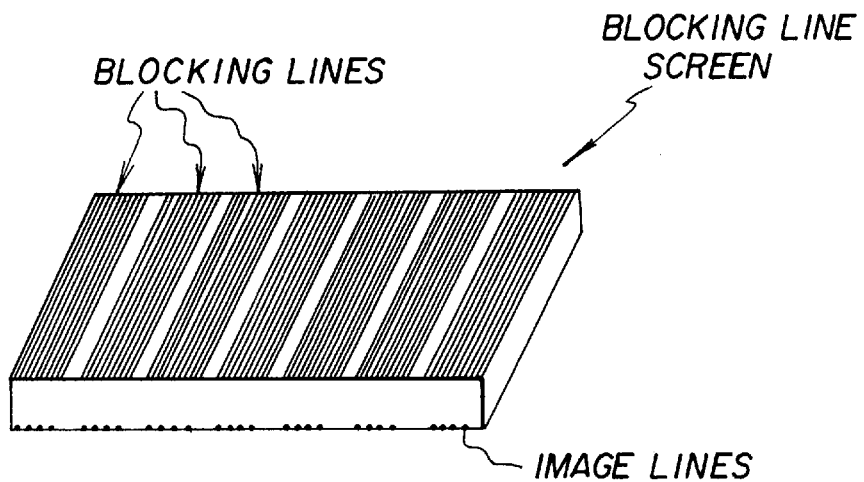
FIG. 1B illustrates a prior art blocking line screen.
Figure 1C:
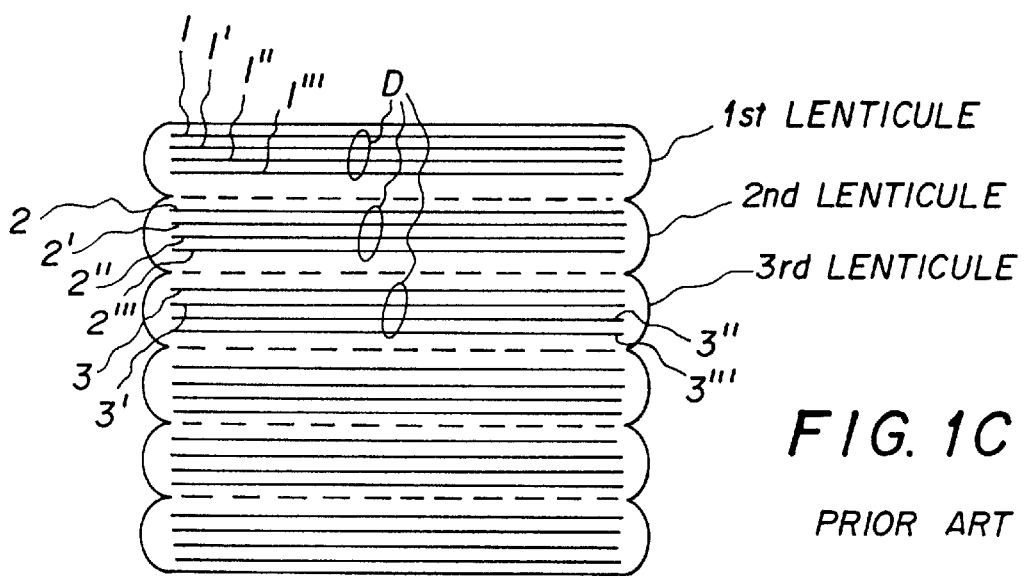
FIG. 1C illustrates image lines that are associated with specific lenticules of the prior art lenticular array shown in FIG. 1A.
Figure 2A:
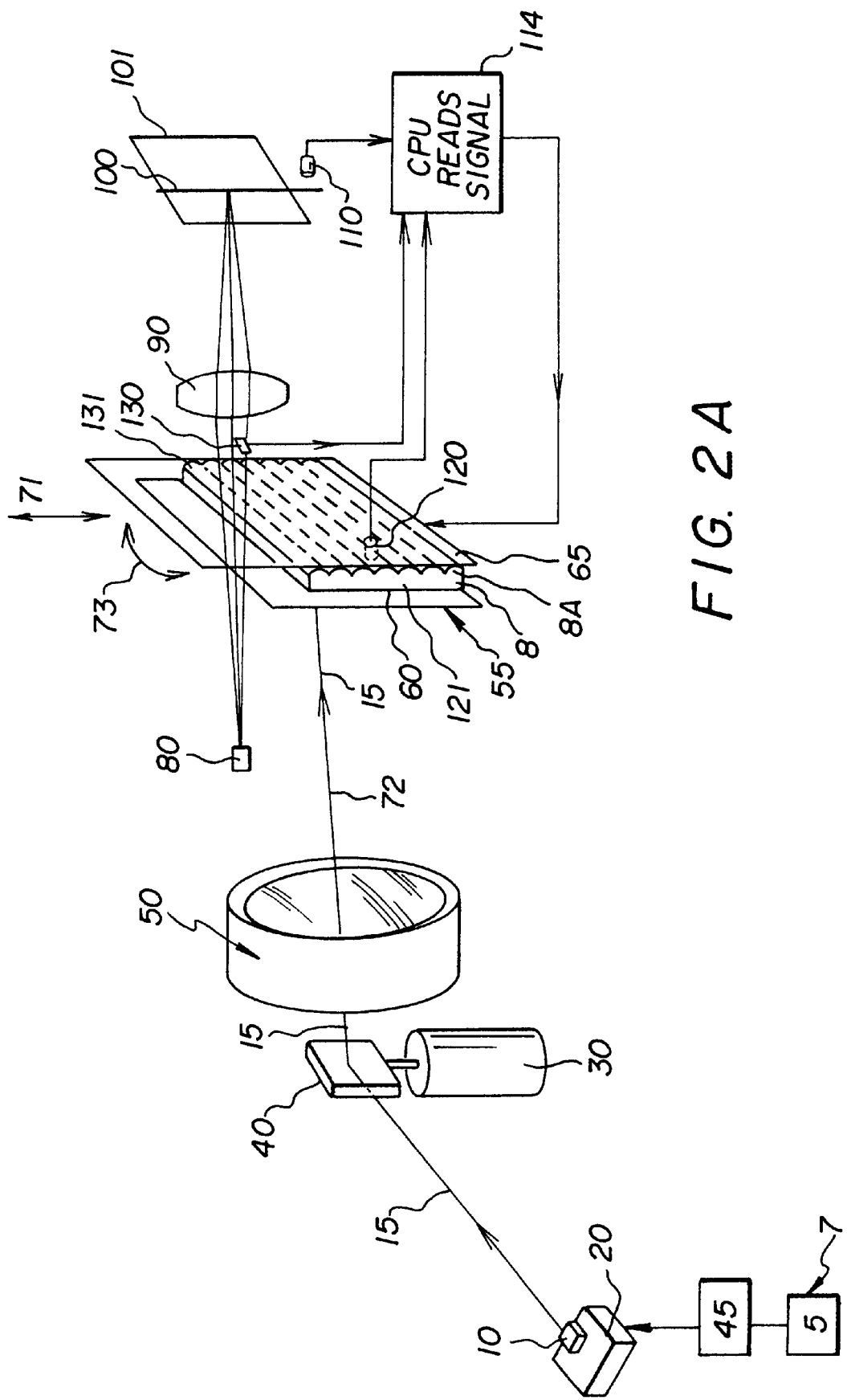
FIG. 2A is a schematic perspective view showing an embodiment of an improved apparatus for laser transfer of a single color to a receiver surface of a lenticular array.
Figure 2B:
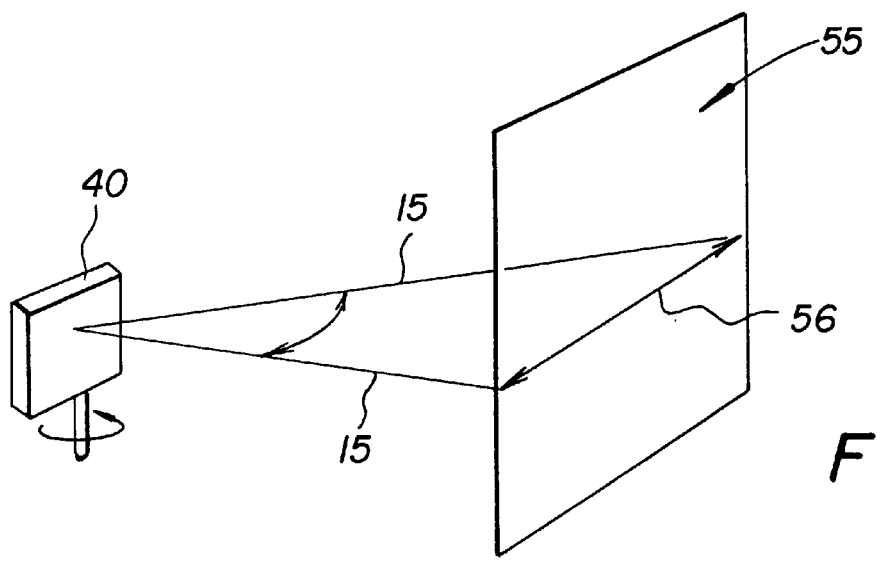
FIG. 2B illustrates the scanning mirror and the donor sheet of FIG. 2A and the motion of the scanned light beam as it moves across the donor sheet.
Figure 3A:
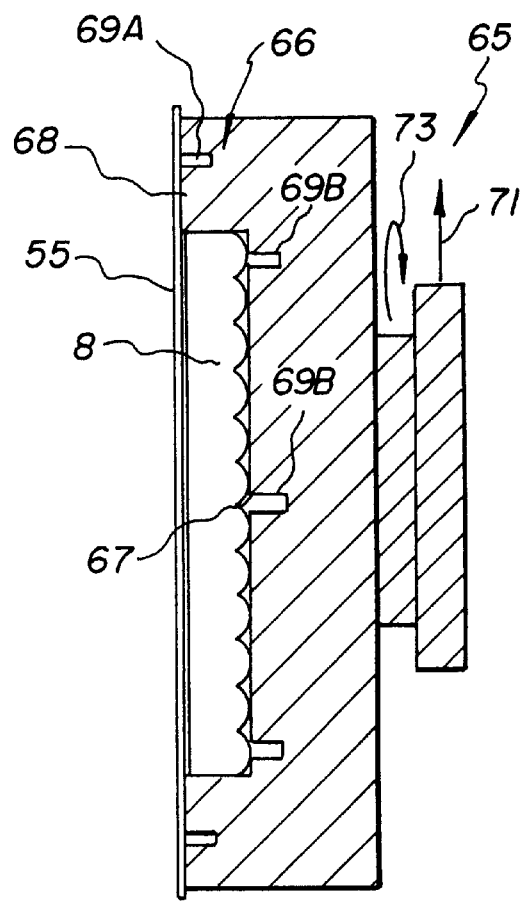
FIG. 3A illustrates a cross-section of a stage that supports the lenticular array and donor sheet.
Figure 3B:
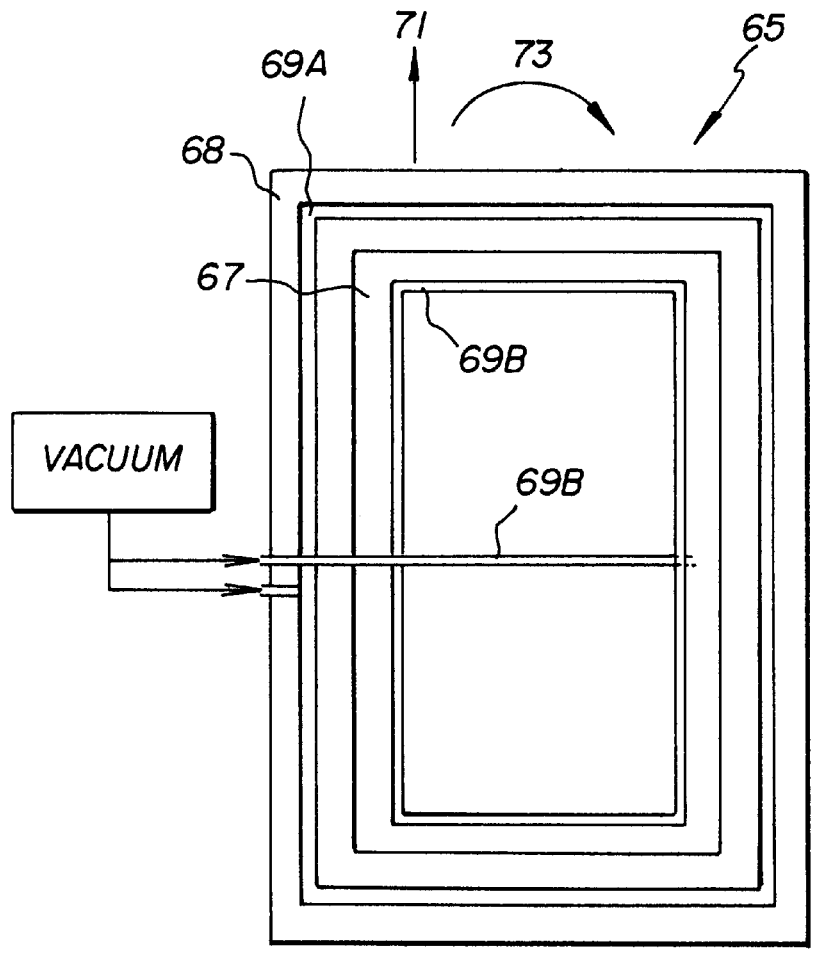
FIG. 3B illustrates the front view of the stage illustrated in FIG. 3A.

A light source, preferably a diode laser 10 having single mode character in one dimension, is mounted on a heat conducting block 20 and directs a light beam 15 toward a rotating scan-mirror 40 mounted on a galvanometer 30. Other scanning methods include polygon scanning and hologon scanning. Galvanometer scanning is particularly preferred because of its combination of simplicity, low cost, flexibility, and wavelength insensitivity. The output power level of the diode laser 10 is controlled by amplitude modulation via a driver circuit 45, which provides a drive signal modulated according to the image data 5. Preferably, the desired printed densities in each successively printed cyan, magenta, and yellow layer are achieved by employing look-up tables to account for the specific response of the printer system. Other modulation techniques besides amplitude modulation are also possible, for example, pulse-width modulation. After reflection from the scan-mirror 40, the modulated light beam 15 passes through a scan-lens 50 which focuses the light beam 15 to a spot in the plane of a donor sheet 55. The motion of the scan mirror 40 sweeps the focused light beam across the donor sheet 55. The scanning light beam 15 moves along the fast-scan axis 56 (FIG. 2B) forming image line 57 (not shown) The direction of the scanning beam 15 across the donor sheet 55 is called the fast scan direction. Suitable donor sheet compositions are taught in U.S. Pat. No. 4,772,582. The donor sheet 55 is in close contact with a receiver surface 60 which is the back surface (i.e., the surface that does not contain the lenticules) of the lenticular array 8 or the blocking line screen 9. (See FIG. 2A.) The donor sheet 55 is separated from the receiver surface 60 by beads (not shown) as described in U.S. Pat. No. 4,876,235. However, the donor sheet 55 may be held in close proximity to the receiver surface 60 using any convenient method. The lenticular array 8 or the blocking line screen 9 is supported on a stage 65 (FIG. 3A, 3B). In this embodiment, the donor sheet 55 is also supported by the stage 65. This is shown in FIGS. 2A and 3A. The stage 65 is capable of rotation and of linear translation. The translation of the stage 65 is in a direction 71, which is perpendicular to the optical axis 72 of the scan-lens 50 and, is also perpendicular to a fast-scan axis 56 defined by the path of the scanning focal spot in the plane of the donor sheet 55. The rotation of the stage 65 is about an axis perpendicular to the plane of the lenticular array 8 (or the blocking line screen 9) and is indicated by the arrow 73. (See FIGS. 2A, 3A, and 3B.)

At least a section of the stage 65 is transparent. Preferably, the platen 66 or a section of the platen 66 is made from an acrylate or polycarbonate polymer to satisfy the transparency requirement. The need for the transparency requirement is discussed later in the specification. The stage 65 includes a vacuum platen 66. The vacuum platen includes a recess 67 for receiving a lenticular array or a blocking line screen, surface 68 for supporting a donor sheet 55, a vacuum groove 69A for holding the donor sheet in place and a vacuum groove 69B for holding either the lenticular array or the blocking line screen in the recess 67.

Preferably, the scan lens 50 is an f-theta lens having a flat image surface. An f-theta lens is characterized by an amount of barrel distortion, such that the focal spot's distance measured along the fast-scan axis from the optical axis 72 of the f-theta lens 50 is proportional to the incoming angle of the light beam.

Figure 4:
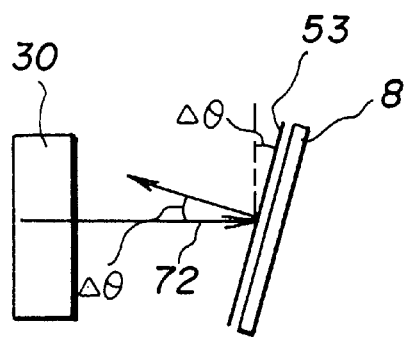
FIG. 4 schematically illustrates that the receiver surface is tilted about the fast-scan axis.

It is preferred that the plane of the receiver surface 60 and the linear translation stage 65 be tilted slightly by an angle $\Delta\theta$ about the fast-scan axis 56 to eliminate any stray light reflections (off the donor or receiver or other surfaces from and going back to the laser 10). It is preferred that the angle $\Delta\theta$ be about five degrees (5°). This is shown in FIG. 4.

A lenticular image viewed from a particular viewing distance (from the lenticular array) needs to present a single view to the observer over the entire image surface. Thus, it is necessary that the pitch of the image lines 57 (forming the composite image) be adjusted precisely with respect to the pitch of the lenticular array 8 or the blocking line screen 9. A composite image with the fine pitch that is adjusted for the pitch of the lenticular array used with this composite image is called a scaled composite image. More specifically, a scaled composite image is defined as a composite image that is scaled in the cross lenticular array direction in accordance with the pitch of the lenticular array for the purposes of achieving the desired viewing distance when viewing the three-dimension or motion images. A typical viewing distance is 8–20 inches and, preferably, 10–16 inches.

Figure 5:
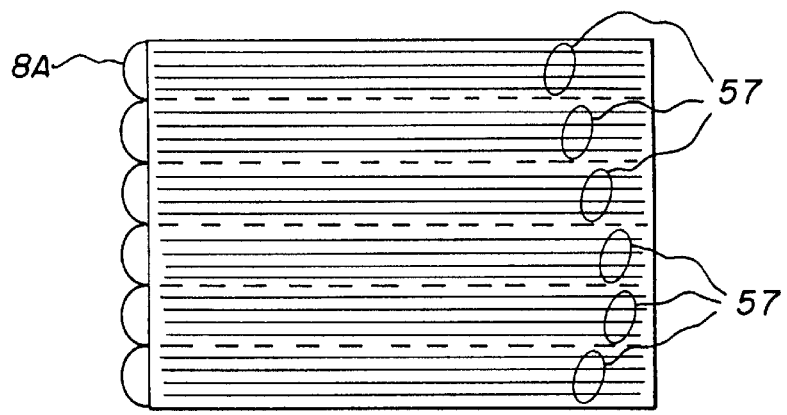
FIG. 5 schematically illustrates that the image lines are rotationally aligned with respect to the lenticules.

Furthermore, it is also necessary that the image lines 57 of the scaled lenticular image are rotationally aligned with respect to the lenticular array, such that they are parallel to the long axis of lenticules (see FIG. 5).

Figure 6A:
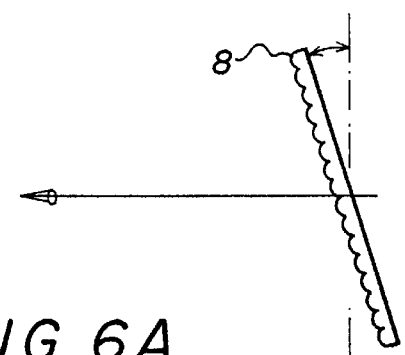
FIGS. 6A–6C illustrates the lenticular array that is being tilted in order to present a viewer with different images.
Figure 6B:
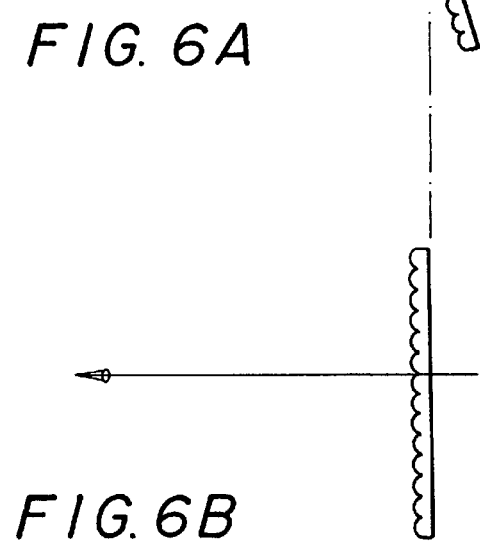
Figure 6C:
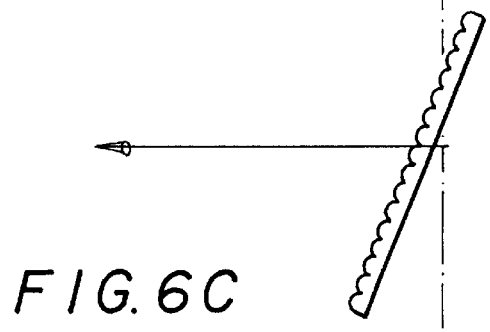
Figure 7:
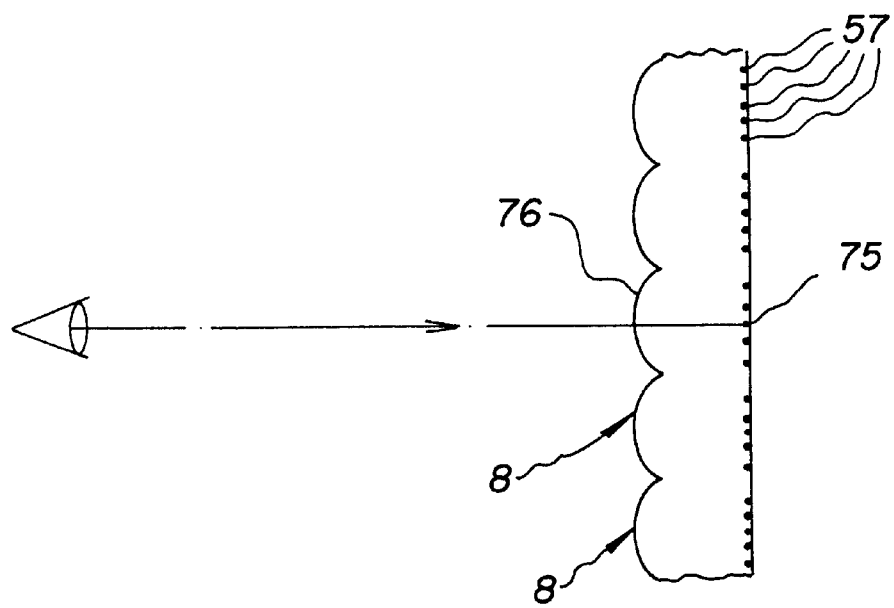
FIG. 7 schematically illustrates the placement of the center image line of the image line set corresponding to a center view of a motion sequence.

As stated above, a lenticular array can present the viewer with a sequence of images. A person swinging a baseball bat from one position to another position would be an example of such sequence of images. This sequence of images can be viewed by tilting the lenticular array with respect to the viewer (FIGS. 6A–6C). It is preferable that the middle picture (i.e., the center view of the motion sequence) be viewed when the lenticular array 8 or the blocking line screen 9 is perpendicular to the observer's line of site. In order for the center-view of a motion sequence to be viewed when the lenticular array 8 or the blocking line screen 9 is oriented at an appropriate angle of tilt with respect to the observer, center image line 75 of the image line set corresponding to the center-view of the sequence should be located at a position directly behind the center of the middle lenticule 76 of the lenticular array (this is shown in FIG. 7) or the center of the middle blocking line of the blocking line screen 9.

Figure 8:
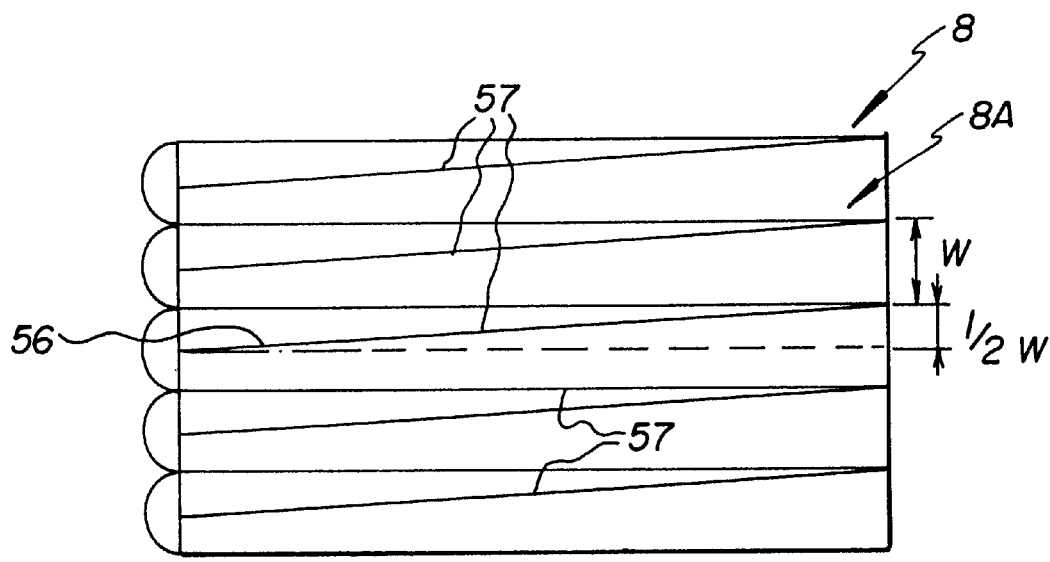
FIG. 8 illustrates rotational misalignment of image lines with respect to lenticules.

An embodiment of rotational alignment of the lenticular array 8 and the image lines of the composite image is accomplished as described hereinbelow. The method of alignment preferably comprises two steps: Step 1—coarse rotational alignment, Step 2—precise rotational alignment. The two-step rotational alignment technique results in a correction of a high range of allowable misalignment and of very precise alignment of the composite image with respect to the lenticular array. Each of the two steps may be used singly, i.e., independent of the other step. The coarse alignment step may be forgone if an initial mechanical registration on placement of the lenticular array on the stage results in a rotational misalignment of less than one half of one lenticule width W over the substantially entire scan line (FIG. 8). This is because the precise alignment that will be described later in the specification provides multiple stable solutions for misalignments of integer multiples of lenticule widths. In other cases, coarse alignment alone may give sufficiently accurate alignment.

Coarse Rotational Alignment

Referring again to FIG. 2A, the coarse rotational alignment of the lenticular array or the blocking line screen with the image lines forming the scaled composite image will be described.

Figure 9A:
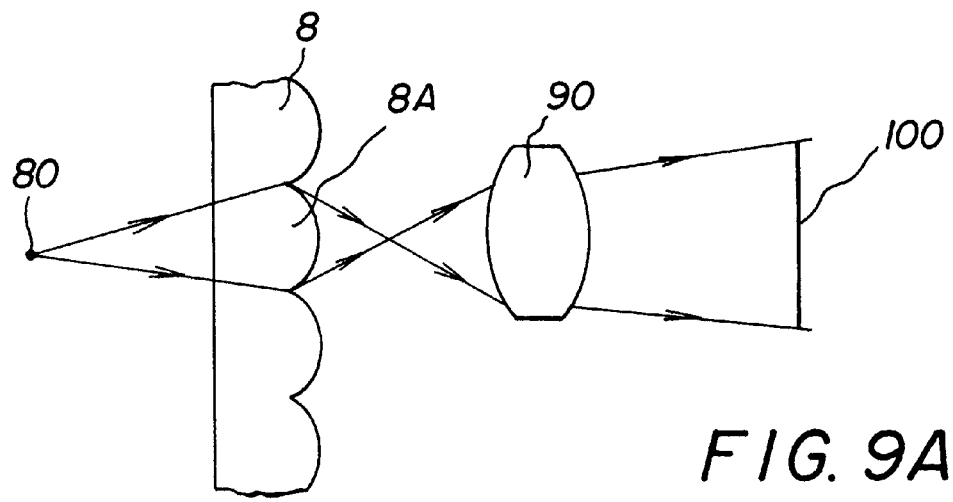
FIGS. 9A and 9B illustrate the formation of a light line with the lenticular array and a coarse alignment lens of FIG. 2A.
Figure 9B:
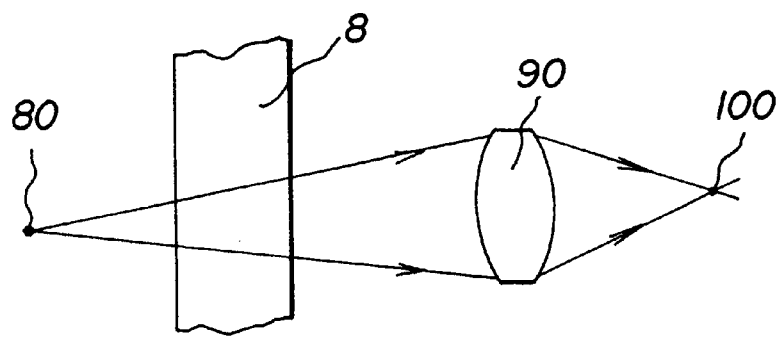

Prior to any transfer of colorant to the receiver surface 60, and preferably before the mounting of a donor sheet 55, a coarse alignment source 80, for example an LED or a laser diode, emits a beam of light 82 which passes through the array with a periodic structure; i.e., the blocking line screen or the lenticular array 8 (through both the image receiving surface and the lenticules containing surface) and through a transparent section of stage 65 towards a coarse alignment lens 90. The coarse alignment source 80 is imaged by the coarse alignment lens 90 as a light line 100, the light line 100 having a direction that is precisely perpendicular to the lenticular array direction for any rotation angle of the lenticular array 8 or the blocking line screen about the optical axis of the scan lens 50. Thus, when the blocking line screen or the lenticular array 8 is rotated by the stage 65 about the axis parallel to the optical axis 72, the light line 100 rotates in the image plane 101 of the coarse alignment lens 90. The image plane 101 is the plane containing the rotating light line 100. The light line 100 formed by the coarse alignment lens 90 and the lenticular array 8 is perpendicular to the lenticular array direction because the interposed lenticular array 8 is made of lenticules 8A that have no optical power along a direction corresponding to the long axes of the lenticules, effectively causing the light beam to refract along the direction perpendicular to this direction. (See FIGS. 9A and 9B.) The light line formed by the blocking line screen and the coarse alignment 90 is perpendicular to the blocking line screen direction. A coarse-rotation detector 110 is positioned in the image plane 101 of the lens 90 some distance away from the optical axis of the lens 90 and is coincident with the light line 100. Preferably, the long axes of the lenticules or the blocking lines of the blocking line screen should be parallel to the fast-scan axis 56. Then, while rotating the lenticular array or the blocking line screen, the detector 110 detects the maximum signal when the lenticular array or the blocking line screen direction is parallel to the fast-scan axis 56. Detection and rotation stage motion control act cooperatively to achieve coarse rotational alignment of the lenticular array 8 or the blocking line screen with respect to the fast-scan axis 56. More specifically, the blocking line screen or the lenticular array 8 is placed in the recess 67 of the stage 65. Stage 65 is capable of translation and rotation. The rotational motion of the stage 65 is activated by a CPU unit 114. As the lenticular array 8 is rotated, the detector detects the presents of light and provides a variable amplitude signal to the CPU 114. The CPU 114, in turn, provides appropriate data that drives the rotation of the stage 65. The angular position either the blocking line screen of the lenticular array 8 corresponding to the maximum signal provided by the detector 110 is determined by the CPU 114 and, the CPU 114 drives the rotation of the stage 65 until the stage 65 reaches its optimum angular position. That is, based on this data, the CPU 114 activates the rotation of the stage 65 until the lenticular array 8 or the blocking line screen is in proper alignment with the fast-scan axis 56 and thus with the image lines about to be written.

Using this method we achieved a degree of alignment that is well below the half-lenticule requirement. Also, in this embodiment, a misalignment of up to +/−6° was automatically corrected. This method could easily accommodate higher misalignments, however it is felt that any reasonable method for mechanically positioning a lenticular array on the stage 65 could register the lenticular array well within the +/−6 degrees of the optimal rotationally aligned position.

Figure 9C:
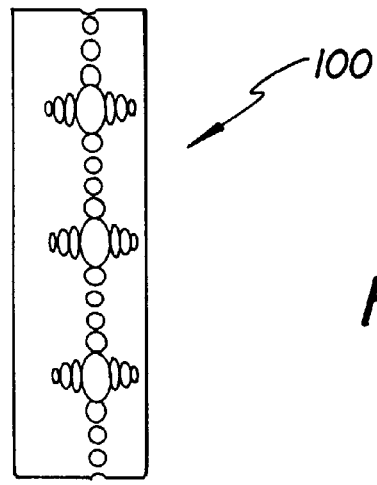
FIG. 9C illustrates the light line formed by a diffraction of the blocking line screen.

The process of providing a coarse rotational alignment of the blocking line screen 9 with respect to the interdigitated image lines is similar to the coarse alignment of the lenticular array 8. However, the light line 100 is formed through interference and diffraction from the blocking line screen 9. More specifically, the blocking line screen acts as many slits and cause a diffraction pattern. The result is a standard many slit diffraction pattern which is approximately a line oriented perpendicular to the slits. There will be some minima where the intensity may be greatly decreased. Therefore, one must choose an off axis region where there is a maximum in intensity (not a minimum) for the placement of the off axis detector 110. FIG. 9C shows the diffraction pattern through many slits.

Precise Rotational Alignment

The precise rotational alignment is accomplished after the coarse rotational alignment. The precise rotational alignment is achieved by using two small photodetectors 120 and 130. These photodetectors 120 and 130 are positioned behind the lenticular array 8 or the blocking line screen 9, preferably with each detector 120, 130 being located near one of the opposite sides 121, 131 of the lenticular array 8 and with each detector being coincident with the fast-scan axis 56. (FIG. 2A) A second light beam, which is preferably the writing beam 15 from the diode laser 10 having a reduced power level (preferably by factor of 10 or more) as compared to actual writing levels, is brought by the scan mirror 40 through a transparent section of the stage 65 to one of the detectors, for example, detector 120, and the resulting signal is stored in the CPU memory while the array 8 is translated in a direction 71 (slow scan direction). It is noted that this light beam could also be from a different light source.

The recorded signal is a periodic one and, the maximum signal occurs when the light beam becomes collinear with the optical axis of each scanned lenticule 8A. Because of the short focal length typical of lenticules, the light beam on traversing a lenticule 8A while this translation is occurring, undergoes a significant sweeping deflection about the detector 120, with the light beam 15 striking the detector 120 when the beam 15 is undeflected. This step is then repeated with the light beam instead being incident upon the second detector 130. The two periodic records of intensity versus position are compared and the phase difference Δ between the two sets of signals is determined. The phase difference Δ gives a measure of the remaining misalignment. The relative position of the stage 65 and thus of the lenticular array 8 or the blocking line screen with respect to fast scan axis 56 can be determined very accurately, for example, by microstepper motor drive or through the use of position encoders such as strip gauges. FIG. 10 shows examples of periodic signals from the detectors 120 and 130 and also shows the phase difference Δ corresponding to the rotational misalignment. This information is used to drive the stage 65 until any remaining misalignment between either the blocking line screen or the lenticular array 8 and the fast-scan axis 56 is rendered negligible. Alternatively, a light beam can be scanned between the two detectors 120, 130 during translation of the lenticular array or the blocking line screen, or two light beams can simultaneously impinge on two detectors 120, 130, or a single wide beam can simultaneously impinge on both detectors 120, 130.

The detectors 110, 120, and 130 may be simple photodetectors as opposed to linear array detectors or position sensitive detectors. Preferred types of detectors include photodiodes, phototransistors, and split photodiodes capable of performing difference measurements. In the case of the split photodiodes, as is well known, rather than identifying a detected signal maximum to verify the incidence of a light beam on a detector, a zero-crossing point is identified instead.

It should be pointed out that the linear translation of the stage 65 may be accomplished in at least two different ways. First, the stage 65 may be stepped to a new position before writing the next image line and then held in a constant position during the writing of the image line. Alternatively, the stage 65 may be driven continuously. It has been found by experiment, that as translation speed increases, it is preferable to drive the stage 65 continuously. Continuous translation of the stage 65 avoids the mechanical ringing associated with strong accelerations required to move the stage 65 in the step and hold mode. However, as a consequence of continuous translation of the stage 65, an additional rotational misalignment arises by the fact that the lenticular array 8 or the blocking line screen 9 moves during the fast-scan time. This additional misalignment is constant and may be easily eliminated by an additional rotation of the stage 65 after the rotational alignment steps described above. In practice, the additional rotation is accounted for and the stage 65 is rotated only once.

The periodic signals from detectors 120 or 130 are also used for determining the pitch of the lenticular array 8 or the blocking line screen 9. If the signals are collected during translation of substantially the entire cross lenticular array dimension(i.e., across most lenticules) or across the blocking line screen 9, the average period of the lenticular array 8 or the blocking line screen 9 may be found with the greatest accuracy. A preferred method of obtaining the pitch of the lenticular array or the blocking line screen from the periodic signals, is to perform a Fourier Transform of the periodic signals from one of the detectors, 120 or 130. Care is taken to include the information carried by the harmonics of the fundamental spatial frequency in order to increase the precision of the measurement. Absent the inclusion of harmonics, the precision of the period measurement will be limited by the finite number of scanned lenticules or the blocking lines that generate the periodic signal. Using the preferred embodiment of the present invention, the pitch of the lenticular array was measured within 200 parts per million. Since the pitch determines the viewing distance, this pitch accuracy is sufficient to have a viewing distance control within +/−1 inches around a nominal viewing distance of 12 inches.

The periodic signals also carry sufficient information to allow center-view alignment, i.e. the condition whereby the appropriate view (for example, of a motion image sequence) is presented to an observer by the appropriate tilt angle of the lenticular array or the blocking line screen with respect to the observer. Often it is preferable that the center view of a motion sequence is observed when a lenticular array or a blocking line screen is oriented perpendicular to the observer's line of site. This condition requires that an image line corresponding to the center view and located substantially near the center lenticule or the center gap between the blocking line should be located on or near the optical axis for that lenticule or along the center of that center gap. For example, such a location is achieved by first using the periodic signals to determine the absolute position of the fast-scan axis 56 relative to the lenticular array 8 and then translating the composite image relative to the lenticular array 8 until the image lines corresponding to the center view of the motion sequence are positioned such that the center image line of the center view is be located on or near the optical axis for the center lenticule.

After rotational alignment, pitch measurement, and center view alignment are performed, the scaled composite image is ready to be printed. A donor sheet 55 containing a dye layer, described, for example, in embodiment 2 of the U.S. Pat. No. 5,183,798, is attached or is placed at the receiving surface 60 of the lenticular array 8. Beads situated in the donor sheet are used to separate the dye layer from the surface 60. This is disclosed in U.S. Pat. No. 4,876,235. The scanning laser beam 15 exposes the donor sheet 55 (during the linear translation of the lenticular array) and transfers dye in registration with the lenticules. The focussed (writing) laser beam size is preferred to be less than 60 micrometers and more preferably less than 15 micrometers in width. It is most preferred that the width of the focussed laser beam 15 and, thus, the width of transferred colorant line be about 10 micrometers or less. Narrow written width of the image lines D is important since the total number of views (which is directly proportional to the number of image lines that can be written behind a given lenticule or a blocking line) is limited by printer resolution in the cross-lenticule or cross-line direction. For full color images, multiple pass colorant transfer is required. In order to produce color images, the first donor sheet is removed without disturbing the receiver and a new donor is applied. The described exposure method is repeated for the second color and then repeated with the third color.

The image may be solvent-fused, thermally-fused or left unfused into the material on the back of the lenticular array. A backing sheet may be applied to add protection to the media, increase stiffness, and give a reflective backing.

Possible limiting factors to image writing speed include the available power of the writing laser, and the fast-scan frequency (number of scans per second). Each of these factors can be overcome by providing instead of a single writing laser, multiple independently modulated lasers. Each of the multiple lasers write along or parallel to the fast-scan axis scanner (scan mirror 40 and the galvanometer 30) and the scan lens 50 in order to form multiple scanning spots in the image plane of the scan lens 50. With this arrangement, multiple lines are written simultaneously, with the writing time being inversely proportional to the number of lasers.

It is noted that the above method and apparatus for alignment of image lines with a lenticular arrays can be also used to align the image lines with the blocking line screen or another periodic structure.

The invention has been described in detail with particular reference to certain preferred embodiments thereof, but it will be understood that variations and modifications can be effected within the spirit and scope of the invention.

| PARTS LIST | |
|---|---|
| 5 | Image data |
| 7 | Digital file |
| 8 | Lenticular array |
| 8A | Lenticules |
| 9 | Blocking line screen |
| 10 | Diode laser |
| 20 | Heat conducting block |
| 15 | Light beam |
| 30 | Galvanometer |
| 40 | Scan-mirror |
| 45 | Driver circuit |
| 50 | Scan-lens |
| 55 | Donor sheet |
| 56 | Fast-scan axis |
| 57 | Image lines |
| 60 | Receiver surface |
| 65 | Stage |
| 66 | Platen |
| 71 | Translation direction |
| 72 | Optical axis of the scan lens 50 |
| 73 | Rotation Direction |
| 75 | Center line |
| 76 | Middle lenticule |
| 80 | Coarse alignment source |
| 82 | Beam of light |
| 90 | Coarse alignment lens |
| 100 | Light line |
| 101 | Image plane of the lens 90 |
| 110 | Coarse motion detector |
| 114 | CPU |
| 120,130 | Photodetectors |
| 121,131 | Opposite sides of lenticular array |

What is claimed is:

1. A method for positioning an array with periodic structures, for forming an image thereon, said method comprising the steps of:
   providing a first beam of light by a first light source;
   passing said first beam of light through said array;
   forming a light line corresponding to said first light source with said first beam of light after said first beam of light passes through said array, such that said light line is perpendicular to long axes of said periodic structures;
   rotating said array to rotate said light line across a first detector;
   producing a signal when said light line sweeps across a first detector;
   determining when a maximum signal is produced by said detector; and
   rotating said array to a proper position based on angular position corresponding to said maximum signal.

2. A method of claim 1, wherein said method further includes the step of:
   producing image lines on a receiver surface of said array by scanning a writing beam across said array such that a fast-scan axis is substantially parallel to said long axes of said periodic structures.

3. A method of claim 2, wherein said writing beam is a laser beam.

4. A method according to claim 2, said method further comprising the steps of:
   bringing a thermal donor material in contact with a back surface of said array;
   modulating said writing beam in accordance with image data; and
   scanning said writing beam across said thermal donor material along said fast-scan axis and, translating said array in a cross fast-scan axis direction, to thermally transfer at least one colorants from said thermal donor material, thereby forming a composite image onto said back surface of said array.

5. A method of claim 1, further comprising the steps of:
   (i) translating said array in a direction substantially perpendicular to said fast-scan axis;
   (ii) scanning a second light beam along said fast-scan axis;
   (iii) detecting said scanned second light beam alternatively by a second detector and a third detector, said second and third detectors being located near opposite edges of said array along said fast-scan axis;
   (iv) providing substantially periodic signals by said second and said third detectors in accordance with their detection of said second light beam;
   (v) determining relative phases of said periodic signals, said relative phases corresponding to misalignment of said array;
   (vi) sensing phases of said periodic signals and rotating said array such that said long axes are substantially parallel to said fast-scan axis.

6. A method of claim 5, further comprising the step of:
   measuring pitch of said periodic structure of said array by determining frequency of said periodic signals.

7. A method according to claim 6, further comprising the step of:
   determining, from said periodic signals, an absolute position of said fast-scan axis relative to a periodic structure located near said array's center; and
   writing an image line corresponding to a center image line of a center view of a motion sequence such that said image line is positioned on or substantially on a long axis of symmetry of the center periodic structure.

8. A method according to claim 7, wherein said periodic structure is a lenticule.

9. A method according to claim 7, wherein said periodic structure is a gap between two blocking lines of a blocking line screen.

10. A method of producing a scaled composite image directly to a lenticular array having a plurality of lenticules, said method utilizing sensing and control of an angular relationship between a fast-scan axis of a focused writing laser beam and a lenticular array direction, said lenticular array direction being parallel to long axes of said lenticules, said method comprising:
   a) bringing said long axes of said lenticules of said lenticular array into rotational alignment with said fast-scan axis of said focused writing laser beam by
      (i) imaging a first light source with a first lens through said lenticular array to form a light line;
      (ii) detecting light composing said light line with a first detector;
      (iii) generating a signal corresponding to the angular relationship between said lenticular array direction and said fast-scan axis; and
      (iv) rotating said lenticular array to achieve rotational alignment between said lenticular array and said fast-scan axis;

(b) bringing thermal donor materials in contact with a back surface of said lenticular array;

c) modulating said focussed writing laser beam in accordance with image data; and d) scanning said focussed writing laser beam along said fast-scan axis across said thermal donor materials and translating said lenticular array in a direction perpendicular to said fast-scan axis to thermally transfer colorants from said thermal donor materials, thereby forming a composite image onto said back surface of said lenticular array.

11. An apparatus for locating an array having a periodic structure, said apparatus comprising:

(i) a stage rotatably supporting said array;

(ii) a first light source, providing a first alignment light beam, said first light source being located to project light onto one side of said array;

(iii) a coarse alignment detector located on another side of said array; and (iv) an alignment lens located between said array and said coarse alignment detector, said alignment lens and said array, together, providing a light line corresponding to said first light source in a plane where said course alignment detector is located, wherein rotation of said array produces a corresponding rotation of said light line in said plane.

12. An apparatus according to claim 11, further comprising:

a stage motion controller capable of (i) activating rotational movement of said stage based on signals received from said coarse alignment detector; and (ii) stopping said rotational movement of said stage when said array is in desired orientation.

13. An apparatus according to claim 11, further comprising:

(i) at least one laser light source providing a laser beam;

(ii) a scanner, scanning said laser beam, therefore providing a scanning laser beam;

(iii) a lens system focusing said scanning laser beam and in cooperation with said scanner providing a scanning focused laser beam in a vicinity of said stage.

14. An apparatus according to claim 13, further comprising a plurality of laser light sources, said laser light sources, in combination, providing a plurality of writing laser beams, said writing laser beams being scanned simultaneously along or parallel to said fast-scan axis, said plurality of writing laser beams being separately modulated to simultaneously produce separate adjacent image lines.

15. An apparatus according to claim 13, wherein said stage is capable of translation in a direction perpendicular to said fast-scan axis, and said stage translates and then stops before each subsequent image line is written by said scanning focused laser beam.

16. An apparatus according to claim 13, wherein said stage is capable of translation in a direction perpendicular to said fast-scan axis, and said stage translates continually while a composite image is being written line-by-line by said scanning focused laser beam.

17. An apparatus according to claim 11 wherein the first light source is a light emitting diode.

18. An apparatus according to claim 11 wherein the first light source is a laser diode.

19. An apparatus according to claim 11 wherein the coarse alignment detector is selected from the group consisting of a photodiode, phototransistor and a split photodetector.

20. An apparatus according to claim 11, further comprising:

(i) a second light source providing a second light beam;

(ii) a scanner scanning said second light beam across said array;

(iii) second and third detectors, said detectors alternatively detecting said scanned second light beam while said array is translated in a slow scan direction, said second and third detectors each providing periodic signals in response to said detection;

(iv) an analyzer determining relative phases of said periodic signals from each of said second and third detectors, said analyzer outputting signals based on said relative phases, said signals being capable of activating rotational motion of said stage until said array is in proper orientation.

21. An apparatus according to claim 20 wherein said second light source is a laser providing a writing laser beam.

22. An apparatus according to claim 20, wherein said second light source is a laser arranged to provide a light beam that is collinear with a writing laser beam.

23. An apparatus according to claim 20, wherein said scanner comprises a galvo mirror.

* * * * *